United States Patent [19]

Makiuchi

[11] Patent Number: 4,716,125
[45] Date of Patent: Dec. 29, 1987

[54] METHOD OF PRODUCING SEMICONDUCTOR LASER

[75] Inventor: Masao Makiuchi, Atsugi, Japan

[73] Assignee: Fujitsu Limited, Kawasaki, Japan

[21] Appl. No.: 935,323

[22] Filed: Nov. 26, 1986

[30] Foreign Application Priority Data

Nov. 30, 1985 [JP] Japan .................. 60-270509

[51] Int. Cl.⁴ ................. H01L 21/203; H01L 21/223; H01L 21/225; H01L 21/265
[52] U.S. Cl. ....................... 437/22; 437/107; 437/129; 437/133; 437/162; 437/167; 372/47
[58] Field of Search ............ 29/569 L, 576 E, 576 B, 29/591; 148/175, 188, 189; 372/45

[56] References Cited

U.S. PATENT DOCUMENTS

| | | | |
|---|---|---|---|
| 4,261,771 | 4/1981 | Dingle et al. | 148/175 |
| 4,378,255 | 3/1983 | Holonyak, Jr. et al. | 29/576 B X |
| 4,511,408 | 4/1985 | Holonyak, Jr. | 148/175 X |
| 4,602,370 | 7/1986 | Tsang | 372/45 |
| 4,647,953 | 3/1987 | Okajima et al. | 29/569 L X |
| 4,670,966 | 6/1987 | De Poorter et al. | 29/569 L |
| 4,671,830 | 6/1987 | Burnham | 148/186 |

FOREIGN PATENT DOCUMENTS 134489 7/1985 Japan.

OTHER PUBLICATIONS

G. H. B. Thompson, *Physics of Semiconductor Laser Devices*, Wiley, 1980, p. 296.

*Primary Examiner*—George T. Ozaki
*Attorney, Agent, or Firm*—Staas & Halsey

[57] ABSTRACT

A compound semiconductor laser comprises a semi-insulating substrate, a lower clad layer, an MQW active layer, an upper clad layer, and two electrodes on the top surface thereof. The upper clad layer is formed so as to have a property of reducing the diffusion coefficient of impurities, from the lower portion toward the upper portion thereof. Impurity atoms are thermally diffused into the lower clad layer from the top surface thereof to form an N-type region and a P-type region, respectively. The side diffusion fronts of the N- and P-type regions are nearly vertical, and thus a narrow MQW active region is defined by disordered portions of the MQW active layer in the N- and P-type regions. The light and carriers are effectively confined in the narrow active region by using the vertical and transverse double-heterostructures and refractive index differences.

12 Claims, 10 Drawing Figures

MOLAR RATIO "$x$" OF AL

MOLAR RATIO "$x$" OF AL

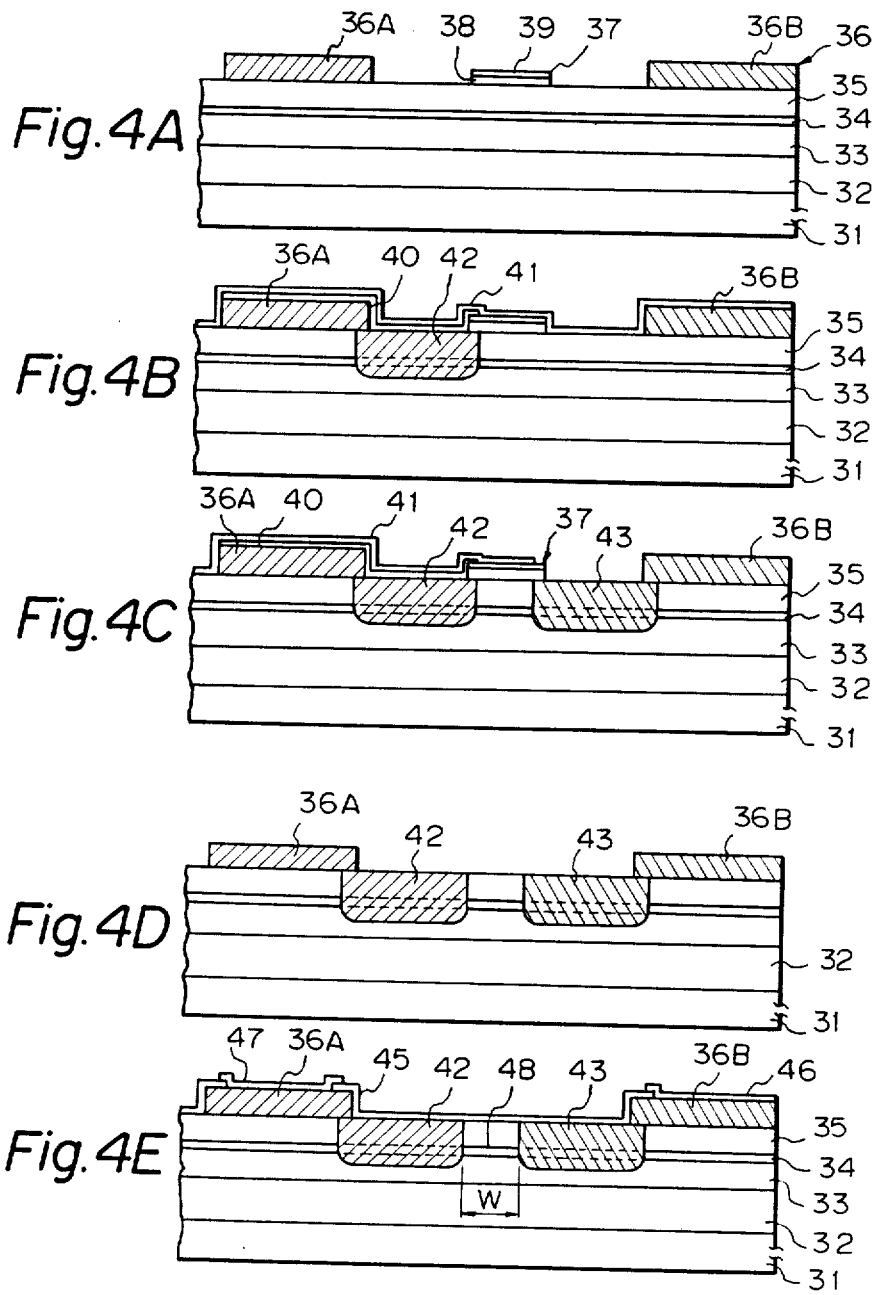

METHOD OF PRODUCING SEMICONDUCTOR LASER

BACKGROUND OF THE INVENTION

(1) Field of the Invention

The present invention relates to a semiconductor laser, more particularly, to a method of producing a compound semiconductor laser having a multiquantum well (MQW) structure.

(2) Description of the Related Art

Compound semiconductor lasers having various structures have been proposed. Most of these semiconductor lasers are provided with electrodes formed on the bottom surface and the top surface thereof so that a current flows through a semiconductor substrate and epitaxially grown semiconductor layers in a direction perpendicular to the layers. Where an application of a semiconductor laser to an optoelectronic integrated circuit (OEIC) device is considered, it is important to form both the electrodes (i.e., N-electrode and P-electrode) of the laser on the same side of the device, to enable an easy connection thereof to an electronic element. Further, preferably both electrodes of the laser are formed on the top surface thereof (i.e., to form the electrodes on the same plane). As an example of the semiconductor laser having the electrodes on the top surface thereof, a transverse junction stripe (TJS) layer has been proposed (cf. G. H. B. Thompson, 'Physics of Semiconductor Laser Devices', Wiley, 1980, p. 296, FIG. 6.5(b)). In this case, an n-AlGaAs clad layer, an n-GaAs active layer, an n-AlGaAs clad layer, and an n-GaAs contacting layer are epitaxially grown on a semi-insulating substrate, and a P-type region is formed by a diffusion of Zn into the layers and substrate. Both N- and P-electrodes are formed on the GaAs contacting layer, and the GaAs layer is separated by an etched groove. The current flows from the GaAs center layer of the P-type (Zn-diffused) region into the n-GaAs active layer, and light emission occurs in a portion of the GaAs active layer adjoining the PN junction. Since the refractive indices of the clad layers can be made smaller than the refractive index of the active layer sandwiched therebetween, the light can be confined in the vertical direction. On the other hand, in the transverse direction, the refractive index change across a homojunction formed by the p-GaAs (Zn diffused) portion and the n-GaAs active layer is small, so that the confinement of light is not satisfactory.

A semiconductor laser with both electrodes formed on the top surface thereof has been proposed in which the confinement of light in the transverse direction is improved and the carriers are confined in an active region by forming a double-heterostructure in an active layer in the transverse direction. This type of laser is disclosed in Japanese Unexamined Patent Publication (Kokai) No. 60-134489. In this case, an i-GaAlAs clad layer, an active layer having an MQW structure, and an i-GaAlAs clad layer are epitaxially grown on a semi-insulating GaAs substrate. P-type impurities (Si) and N-type impurities (Zn) are selectively introduced through the active layer from the top surface thereof, to form a P-type conductive region and an N-type conductive region, respectively. The MQW structure of the portions of the active layer in the P-type and N-type region is disordered to give those portions an average composition. Thus the active layer comprises the disordered portions and the remaining MQW structure portion (i.e., the active region) sandwiched therebetween, thus forming a transverse double-heterostructure. The refractive index of the disordered portions is smaller than the average refractive index of the MQW structure active layer. Furthermore, the i-GaAlAs clad layers and the active region of the active layer vertically sandwiched therebetween form the vertical double-heterostructure, and the refractive index of the clad layers is smaller than an average refractive index of an MQW structure consisting of the GaAs wells and GaAlAs barrier layers. Accordingly the current flows through the active region of the active layer from the P-type region to the N-type region in the transverse (width) direction. Accordingly, the light and the carriers are effectively confined in the MQW active region of the active layer, compared with the above-mentioned TJS laser.

The introduction of the impurities for the formation of the P- and N-type regions is performed by an ion-implantation method and a thermal diffusion method. The i-GaAlAs upper clad layer has, in general, a thickness of from 1 to 1.5 μm, to obtain an effective confinement of the light. When the impurities are thermally diffused to extend into the lower clad layer through the upper clad layer and the active layer from the top surface, the impurities diffuse in the vertical direction, and simultaneously, in the transverse direction. This transverse diffusion prevents a narrowing of the width (stripe width) of the active region. Thus the thermal diffusion method cannot attain the formation of a narrow active region having a width of less than 2 μm. The narrow stripe width increases the carrier density, and thus enhances the stimulated emission and reduces the threshold current. On the other hand, when the impurities are ion-implanted so as to reach the lower clad layer through the upper clad layer and the active layer, it is necessary to use an extremely high energy for the impurity ions, which generates crystal defects. Although a conventional annealing for the activation and recovery of crystal defects is performed, unrecovered defects are still present, which generate a current flow that makes no contribution to the radiation. Thus the ion-implantation method does not reduce the threshold current or increase the reliability of the device.

SUMMARY OF THE INVENTION

An object of the present invention is to provide a method of forming a narrow width active region in an MQW active layer, which active region is sandwiched between disordered regions of the MQW active layer of a compound semiconductor laser.

Another object of the present invention is to provide a method of producing a compound semiconductor laser comprising a semi-insulating substrate, a lower clad layer, an MQW active layer, an upper clad layer, N-and P-electrodes formed on the top surface thereof, and P- and N-type regions extending from the top surface into the lower clad layer and defining a narrow width of less than 2 μm, preferably from 1 to 2 μm, of the active region.

Another object of the present invention is to provide a method of producing a semiconductor laser having improved properties such that the threshold current value is much decreased, the reliability of the laser device is increased, and a single-mode emission is easily realized.

The above-mentioned and other objects of the present invention are attained by providing a method of producing a compound semiconductor laser comprising a semi-insulating substrate, a high resistance lower clad layer, an MQW active layer, a high resistance upper clad layer, P-type and N-type conduction regions formed in the layers, and P- and N-electrodes formed on the top surface thereof, which method comprises the steps of forming the upper clad layer having a property of reducing the diffusion coefficient of impurities from the lower portion toward the upper portion thereof, and selectively thermally diffusing impurity atoms into the lower clad layer through the upper clad layer and the active layer to form the P-type and N-type regions, respectively, so that the diffusion fronts of the P-type and N-type regions have nearly vertical sides which define an active region of the active layer.

According to the present invention, the diffusion coefficient of impurity atoms in the upper portion of the upper clad layer is smaller than that in the lower portion, and thus, after the thermal diffusion treatment, the transverse diffusion distance of impurity atoms in the uppermost portion is shorter than the diffusion distance in the other portion.

BRIEF DESCRIPTION OF THE DRAWINGS

The present invention will become more apparent from the description of the preferred embodiments set forth below with reference to the accompanying drawings, in which:

FIGS. 4A to 4E are schematic sectional views of a semiconductor laser in various stages of production according to the method of the present invention.

DESCRIPTION OF THE PREFERRED EMBODIMENTS

The principle of the present invention is now explained in comparison with the prior art.

Figure 1A:
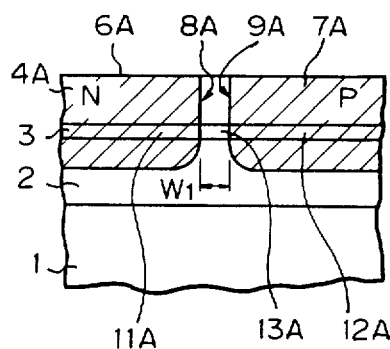
FIG. 1A is a schematic sectional view of a semiconductor laser produced in accordance with the method of the present invention.
Figure 1B:
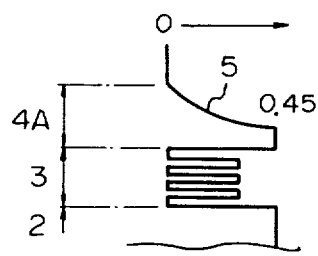
FIG. 1B is a diagram showing a molar ratio of Al in grown semiconductor layers of the laser of FIG. 1A.

Referring to FIG. 1A, a high resistance $Al_xGa_{1-x}As$ clad layer 2 (wherein $x=0.45$) is epitaxially formed on a semi-insulating layer 1. An MQW active layer 3 is formed on the clad layer 2 by alternately growing GaAs thin layers and $Al_xGa_{1-x}As$ thin layers (wherein $x=0.4$). In accordance with the present invention, a high resistance $Al_xGa_{1-x}As$ clad layer 4A (wherein $0 \leq x \leq 0.45$) is epitaxially formed on the active layer 3. In this case, the lower portion of the clad layer 4A coming into contact with the GaAs thin layer of the active layer 3 is of $Al_xGa_{1-x}As$ (wherein $x=0.45$), and the content of the Al is decreased (preferably, according to a parabolic line 5 in FIG. 1B) to zero. This clad layer 4A is grown by a molecular beam epitaxy (MBE) method or a metal-organic chemical vapor deposition (MOCVD) method. The decrease of the Al content of the AlGaAs layer is attained by controlling the Al cell temperature of an MBE device, and by controlling a flow rate of a gas of an organometal of Al (e.g., $(CH_3)_3Al$ or $(C_2H_5)_3Al$) into a reaction vessel of the MOCVD device. The molar ratio x of Al in the layers 2, 3 and 4A is shown in FIG. 1B. Further, N-type impurity atoms (e.g., Si or S) are selectively thermally diffused into the clad layer 2 through the clad layer 4A and the active layer 3 from the top surface portion, which is not masked with a masking layer, to form the N-type conduction region 6A. In another step, P-type impurity atoms (e.g., Zn) are selectively thermally diffused into the clad layer 2 through the clad layer 4A and the active layer 3 from another top surface portion, which is also not masked with a masking layer, to form the P-type conduction region 7A.

This thermal diffusion is carried out by using a solid source or a vapor source. Note, it is possible to carry out the thermal diffusion by ion-implanting the impurity atoms to a shallow depth of, e.g., from 0.2 to 0.3 $\mu m$, and annealing, to diffuse the implanted atoms. The annealing can recover crystal defects caused by the ion-implantation. The side diffusion fronts 8A and 9A of the N-type region 6A and the P-type region 7A form nearly vertical planes, as shown in FIG. 1A. As a result, the active layer 3 consists of disordered portions 11A and 12A caused by the thermal diffusion, and an MQW active region 13A sandwiched between those disordered portions 11A and 12A. It is possible to make the width (stripe width) $W_1$ of the MQW active region 13A less than 2 $\mu m$, preferably from 1 to 2 $\mu m$.

The active region 13A is vertically sandwiched between the AlGaAs clad layer 2 and the $Al_xGa_{1-x}As$ ($x=0.45$) portion of the clad layer 4A, which layer 2 and portion of the clad layer 4A have a larger band gap and a smaller refractive index than those of the GaAs thin layers and the AlGaAs thin layers of the MQW active region 13A.

Further, the narrow active region 13A is transversely sandwiched between the disordered portions 11A and 12A, which active region 13A is substantially AlGaAs and has a refractive index larger than an average refractive index of the GaAs and AlGaAs thin layers. Therefore, the confinement of the carriers and the light in the narrow MQW active region of a laser can be effectively realized, thus enhancing the stimulated emission and reducing the threshold current.

Figure 2A:
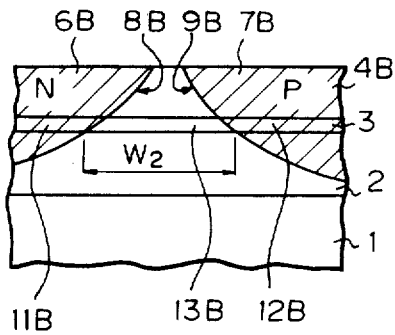
FIG. 2A is a schematic sectional view of a semiconductor laser produced in accordance with the prior art.

In the prior art, referring to FIG. 2A, the high resistance AlGaAs clad layer 2, and the MQW active layer 3 are epitaxially formed on the semi-insulating GaAs substrate 1 in the same manner as described above. A high resistance $Al_xGa_{1-x}As$ ($x=0.45$) clad layer 4B is epitaxially formed on the active layer 3.

Figure 2B:
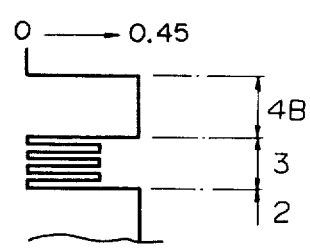
FIG. 2B is a diagram showing a molar ratio of Al in grown semiconductor layers of the laser of FIG. 2A.

The molar ratio x of Al in the layers 2, 3, and 4B is shown in FIG. 2B. By using the above-mentioned thermal diffusion method, N-type impurity atoms and P-type impurity atoms are selectively diffused into the clad layer 2 through the clad layer 4B and the active layer 3, to form an N-type conduction region 6B and a P-type conduction region 7B, respectively.

Figure 3:
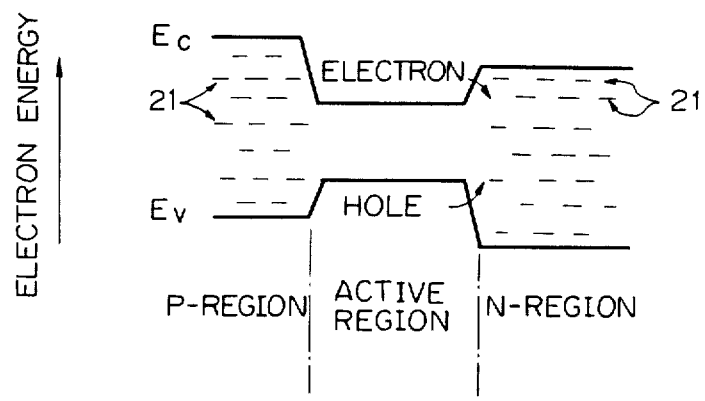
FIG. 3 is a diagram showing an electron energy of a P-type region, an N-type region, and an active region sandwiched therebetween in a semiconductor laser produced in accordance with the prior art.

In this case, the impurity atoms are uniformly diffused in all directions, so that the diffusion fronts 8B and 9B of the N-type region 6B and the P-type region 7B form curved planes, as shown in FIG. 2A. The active layer 3 consists of disordered portions 11B and 12B and an MQW active region 13B sandwiched therebetween. Since the N-type region 6B and the P-type region 7B must not come into contact with each other, the width $W_2$ of the MQW active region 13B is made relatively large. Because of the wide MQW active region 13B, the carrier density is lowered, which prevents any enhancement of the stimulated emission and decrease in the threshold current. Furthermore, when the N-type region 6B and the P-type region 7B are formed by using an ion-implantation method in which the impurity ions are directly implanted into the clad layer 2, the shapes of the N-type and P-type regions become similar to those of the N-type and P-type regions 6A and 7A (FIG. 1A). In this case, crystal defects caused by the ion-implantation cannot be completely recovered by annealing, and thus local levels 21 are formed in an electron energy diagram, biased in the forward direction, as shown in FIG. 3. Some electrons and some holes are trapped by these local levels, and thus a current flow which makes no contribution to the radiation occurs. Therefore, the threshold current value is high, the radiation efficiency is low, and the lifetime of the device is short.

A compound semiconductor laser according to the present invention is produced in the following manner.

As shown in FIG. 4A, an undoped GaAs buffer layer 32 having a thickness of 3 μm is epitaxially formed on an semi-insulating GaAs substrate 31, and a high resistance $Al_{0.45}Ga_{0.55}As$ clad layer 33 having a thickness of 2 μm is epitaxially formed on the buffer layer 32. Then an MQW layer 34 is formed by alternatively growing five undoped GaAs thin layers and four n-$Al_{0.3}Ga_{0.7}As$ thin layers by the MBE method. Each of the GaAs thin layers has a thickness of 8 nm, and each of the AlGaAs thin layers has a thickness of 12 nm and a carrier (Si) concentration of $1 \times 10^{17}$ cm$^{-3}$. A high resistance AlGaAs clad layer 35 having a thickness of 1.5 μm is then formed on the GaAs thin layer of the MQW layer 34 by the MBE method. In accordance with the present invention, the layer 35 consists of a lower portion of $Al_{0.45}Ga_{0.55}As$ having a thickness of 0.5 μm and an upper portion of $Al_xGa_{1-x}As$, wherein x is decreased from 0.45 to 0, as shown in FIG. 1B. An undoped GaAs cap layer 36 having a thickness of 1 μm is formed on the clad layer 35. The cap layer 36 is selectively etched by a reactive ion etching method to form cap layer portions 36A and 36B. A mask 37 comprising an $SiO_2$ layer 38 and an $Si_3N_4$ layer 39 is formed on the clad layer 35.

In FIG. 4B, a polycrystalline silicon layer 40 is deposited over the top surface and etched so as to remain on the cap layer portion 36A and an exposed portion of the clad layer 35. An $SiO_2$ layer 41 is formed over the top surface. Then a thermal diffusion of impurity atoms (Si) is carried out at a temperature of 850° C for 2.5 hours, to form an N-type conduction region 42 extending into the clad layer 33. At the same time, the GaAs cap layer portion 36A is doped with Si to make the portion 36A N-type. The portion 36A is electrically connected to the N-type region 42. As a result of the thermal diffusion, a portion of the MQW layer 34 in the N-type region 42 is disordered and the side diffusion front of the N-type region becomes nearly vertical.

In FIG. 4C, the $SiO_2$ layer 41 is selectively etched to expose another portion of the clad layer 35 and the cap layer portion 36B. A second thermal diffusion of impurity atoms (Zn) is then carried out under a zinc atmosphere at a temperature of 600° C. for 9 hours, to form a P-type conduction region 43 extending into the clad layer 33. At the same time, the GaAs cap layer portion 36B is doped with Zn to make the portion 36B P-type. The portion 36B is electrically connected to the P-type region 43. As a result of the thermal diffusion, a portion of the MQW layer 34 in the P-type region 43 is disordered and the side diffusion front of the P-type region becomes nearly vertical.

The $SiO_2$ layer 41, the polycrystalline silicon layer 40, and the mask 37 are removed by using a suitable etchant, as shown in FIG. 4D.

In FIG. 4E, an $SiO_2$ protecting layer 45 is formed over the top surface. A portion of the $SiO_2$ layer 45 on the cap layer portion 36B is then removed, and an electrode metal 46 of AuZn/Au is deposited on the exposed cap layer portion 36B and alloyed at a temperature of 470° C. for 5 minutes to form an ohmic contact. Then, another portion of the $SiO_2$ layer 45 on the cap layer portion 36A is removed, and another electrode metal 47 of AuGe/Au is deposited on the exposed cap layer portion 36A and is alloyed at a temperature of 430° C. for 1 minute. Thus the obtained semiconductor laser has an MQW active portion 48 in the active layer 34, which portion is sandwiched between the disordered portions in the N-type region 42 and P-type region 43. The width W of the MQW active region is 0.5 μm, i.e., less than 2 μm, and is accurately controlled compared with the prior art.

In the produced laser provided with N- and P-electrodes on the top surface thereof, a current flows from the P-electrode and the P-type region through the active region in the transverse direction to the N-type region and the N-type electrode. Since the active region is sandwiched vertically and transversely between semiconductor layers having a refractive index smaller than the average refractive index of the MQW structure of the active region, and the width of the active region is narrower than the prior art, the light and carriers are effectively confined in the narrow active region. These confinements enhance the stimulated emission and reduce the threshold current.

It will be obvious that the present invention is not restricted to the above-mentioned embodiments, and that many variations are possible for persons skilled in the art without departing from the scope of the invention. For example, another compound semiconductor material, such as an InP system, can be used instead of the GaAs system.

I claim:

1. A method of producing a semiconductor laser comprising the steps of:
   forming a first high resistance clad layer, having a first band gap, on a semi-insulating semiconductor substrate;
   forming an active layer of a multiquantum well structure, in which quantum wells have a second band gap narrower than said first band gap, on said first clad layer;
   forming a second high resistance clad layer on said active layer, said second clad layer having a property of reducing the diffusion coefficient of impurities toward the upper surface thereof, from the active layer side, the lower portion of said second clad layer having a third band gap wider than said second band gap;
   selectively thermally diffusing first impurity atoms into said first clad layer through a first portion of said second clad layer and a first portion of said active layer, so that said first portion of said active layer is disordered and the diffused portions form a first conduction region of a first conductivity type; and selectively thermally diffusing second impurity atoms into said clad layer through a second portion of said second clad layer and a second portion of said active layer at a desired distance from said first portion of said active layer, so that said second portion of said active layer is disordered and the diffused portions form a second conduction region of a second conductivity type opposite to that of said first conductivity type.

2. A method according to claim 1, further comprising steps of: forming electrodes electrically connected with said first and second conduction regions, respectively.

3. A method according to claim 1, wherein said second clad layer is a compound semiconductor, and at least one component content of said compound semiconductor is varied.

4. A method according to claim 3, wherein the step of forming said second clad layer is carried out by a molecular beam epitaxy method.

5. A method according to claim 4, wherein a component content is varied by controlling a cell temperature for said component.

6. A method according to claim 3, wherein the step of forming said second clad layer is carried out by a metal-organic chemical vapor deposition method.

7. A method according to claim 6, wherein a component content is varied by controlling a flow rate for said component.

8. A method according to claim 3, wherein said second clad layer is of AlGaAs and the Al content is gradually reduced from a lower portion toward an upper portion of said second clad layer.

9. A method according to claim 1, wherein the steps of thermal diffusion for impurity atoms are carried out by using a vapor source.

10. A method according to claim 1, wherein the steps of thermal diffusion for impurity atoms are carried out by using a solid source.

11. A method according to claim 1, wherein the steps of thermal diffusion for impurity atoms are carried out by ion-implanting said atoms at a shallow depth and carrying out an annealing process to diffuse said implanted atoms.

12. A method of producing a compound semiconductor laser comprising steps of:
   forming a first high resistance clad layer of AlGaAs on a semi-insulating GaAs substrate;
   forming a multiquantum well active layer comprising GaAs wells and AlGaAs barrier layers on said first clad layer;
   forming a second high resistance clad layer of AlGaAs on said active layer, the Al content of said second clad layer being decreased toward an upper portion from a lower portion thereof;
   forming a cap layer of undoped GaAs on said second clad layer;
   selectively removing said cap layer;
   selectively thermally diffusing P-type impurity atoms into said first clad layer through said second clad layer and said active layer to form a P-type region;
   selectively thermally diffusing N-type impurity atoms into said first clad layer through said first clad layer and said active layer to form an N-type region;
   selectively forming a P-electrode on said cap layer;
   alloying said P-electrode to cause an electrical connection thereof with said P-type region;
   selectively forming an N-electrode on said cap layer; and
   alloying said N-electrode to cause an electrical connection thereof with said N-type region.

* * * * *

UNITED STATES PATENT AND TRADEMARK OFFICE
CERTIFICATE OF CORRECTION

PATENT NO. : 4,716,125

DATED : December 29, 1987

INVENTOR(S) : Masao MAKIUCHI

It is certified that error appears in the above-identified patent and that said Letters Patent is hereby corrected as shown below:

Column 4, line 32, change "ALGaAs" to --AlGaAs--;
          line 36, change "AIGaAs" to --AlGaAs--.

Signed and Sealed this

Fourteenth Day of June, 1988

Attest:

DONALD J. QUIGG

*Attesting Officer*     *Commissioner of Patents and Trademarks*